United States Patent
Nakamura

(10) Patent No.: US 9,966,569 B2
(45) Date of Patent: May 8, 2018

(54) ORGANIC LIGHT EMISSION APPARATUS AND ELECTRONIC EQUIPMENT

(71) Applicant: SEIKO EPSON CORPORATION, Tokyo (JP)

(72) Inventor: Hisatoshi Nakamura, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days. days.

(21) Appl. No.: 15/061,184

(22) Filed: Mar. 4, 2016

(65) Prior Publication Data

US 2016/0293889 A1    Oct. 6, 2016

(30) Foreign Application Priority Data

Mar. 31, 2015 (JP) ................... 2015-073784

(51) Int. Cl.
*H01L 29/08* (2006.01)
*H01L 51/52* (2006.01)

(52) U.S. Cl.
CPC .................. *H01L 51/5256* (2013.01)

(58) Field of Classification Search
CPC .................................... H01L 51/5256
USPC ............................ 257/40; 428/218, 412, 480
See application file for complete search history.

(56) References Cited

U.S. PATENT DOCUMENTS

| 8,846,187 | B2* | 9/2014 | Fukuda | C23C 16/30 427/569 |
| 9,496,518 | B2* | 11/2016 | Kwack | H01L 51/5253 |
| 2006/0088951 | A1 | 4/2006 | Hayashi et al. | |
| 2006/0204772 | A1* | 9/2006 | Mukunoki | C08J 7/06 428/480 |
| 2007/0114521 | A1* | 5/2007 | Hayashi | H01L 51/5253 257/40 |
| 2008/0274268 | A1 | 11/2008 | Ogino | |
| 2009/0115321 | A1 | 5/2009 | Hayashi | |
| 2010/0003482 | A1* | 1/2010 | Fukuda | C23C 16/30 428/218 |
| 2010/0201929 | A1 | 8/2010 | Okada et al. | |
| 2012/0104945 | A1 | 5/2012 | Adachi | |
| 2013/0313547 | A1* | 11/2013 | Nakano | H01L 51/5253 257/43 |

(Continued)

FOREIGN PATENT DOCUMENTS

| JP | 2006-147528 A | 6/2006 |
| JP | 2006-164543 A | 6/2006 |

(Continued)

*Primary Examiner* — Mohammed Shamsuzzaman
(74) *Attorney, Agent, or Firm* — Oliff PLC

(57) ABSTRACT

An organic EL apparatus includes a substrate, an organic EL element that is disposed on the substrate, and a sealing layer that seals the organic light emission element by covering, and the sealing layer is a multilayer body which includes a first sealing layer, a buffer layer, and a second sealing layer respectively having different functions and being sequentially stacked from the organic EL element side. The second sealing layer is mainly made of silicon oxynitride, and includes an inner layer, an intermediate layer, and an outer layer being sequentially stacked on the organic EL element side. Stress of the intermediate layer is equal to or less than stress of the inner layer, and stress of the outer layer is greater than the stress of the inner layer.

18 Claims, 7 Drawing Sheets

(56) References Cited

U.S. PATENT DOCUMENTS

2015/0099126 A1* 4/2015 Honda ................ H01L 51/5253
428/412
2015/0108435 A1* 4/2015 Huh .................... H01L 51/5256
257/40

FOREIGN PATENT DOCUMENTS

| | | |
|---|---|---|
| JP | 2007-265841 A | 10/2007 |
| JP | 2007-273274 A | 10/2007 |
| JP | 2008-153004 A | 7/2008 |
| JP | 2008-270172 A | 11/2008 |
| JP | 2009-117079 A | 5/2009 |
| JP | 2010-181777 A | 8/2010 |
| JP | 2012-209209 A | 10/2012 |
| WO | 2011/001492 A1 | 1/2011 |

* cited by examiner

ORGANIC LIGHT EMISSION APPARATUS AND ELECTRONIC EQUIPMENT

BACKGROUND

1. Technical Field

The present invention relates to an organic light emission apparatus and an electronic equipment.

2. Related Art

An organic electroluminescence element (organic EL element) is configured to have an anode, a cathode, and a functional layer including an organic light emission layer interposed between these electrodes. The functional layer emits light because energy, which is generated by recombining holes injected from the anode side and electrons injected from the cathode side in an organic light emission layer, is converted into fluorescence or phosphorescence.

However, when moisture, oxygen, or the like are invaded into the functional layer through the anode or the cathode from the outside, an injection of a carrier (hole or electron) into the organic light emission layer is suppressed, thereby deteriorating brightness of emission or losing a function of the emission because a quality of the functional layer is changed. Therefore, a scotoma, which is a so called dark spot, is generated.

In the organic EL apparatus (organic light emission apparatus) including such an organic EL element (organic light emission element), a sealing layer which covers a plurality of the organic EL elements is formed for preventing an invasion of the moisture, oxygen, or the like.

As such a sealing layer, for example, in JP-A-2006-147528, a multilayer body configured to have three layers is proposed in which a cathode protection layer made of an organic material such as silicon oxynitride, a buffer layer (planarization layer) made of a resin material such as an epoxy resin, and a gas barrier layer made of an organic material such as silicon oxynitride are sequentially stacked from a cathode electrode side.

In the organic EL apparatus including the sealing layer of such a configuration, since the cathode protection layer and the gas barrier layer are made of an inorganic material such as silicon oxynitride, in addition to the gas barrier layer, the cathode protection layer may also exert the gas barrier properties for preventing the invasion of moisture, oxygen, or the like, in a same manner as the gas barrier layer.

When the cathode protection layer exerts the gas barrier properties, two layers of the cathode protection layer and the gas barrier layer have the gas barrier properties, whereby the sealing layer exerts excellent the gas barrier properties, for example, in comparison with a case in which the sealing layer has the gas barrier layer of one layer.

Accordingly, when both the cathode protection layer and the gas barrier layer exert the gas barrier properties, first, it is thought that the organic EL element is prevented from generating a dark spot (scotoma) so that life span of the organic EL apparatus is improved.

However, the cathode protection layer, the buffer layer, and the gas barrier layer are formed in the chamber for forming by being sequentially stacked at the time of forming the sealing layer, and in this forming process, for example, a configuration material of the cathode protection layer attached to a wall portion of the chamber for forming may become a mass, such that the mass is fallen down on the buffer layer as the foreign material. Also, when the gas barrier layer is formed in this state, a dark spot which is caused by a convex state due to the foreign material may be generated. In order to minimize the convex state due to the foreign material, it is considered that the gas barrier layer is formed to be relatively thick. However, in this case, stress of the gas barrier layer is relatively high, as a result, a wrinkle, or the like is generated on the buffer layer, and the buffer layer and the gas barrier layer are delaminated. In addition, even when the stress of the gas barrier layer can be set to be low by changing the configuration material of the gas barrier layer, the gas barrier properties are also deteriorated according to decreasing of the stress thereof.

In addition, in JP-A-2008-270172, in order to prevent a delamination between the layers, a configuration is disclosed in which the layers having different stress directions (tension stress and pressure stress) from each other are stacked alternately; however, even in the configuration, when stress is concentrated on interface between the layers, it is concerned that the delamination is generated. Moreover, since it is known that the layer having the excellent tension stress is generally weak at the gas barrier properties, desired gas barrier properties are need to be secured by making the thickness be greater.

SUMMARY

An advantage of some aspects of the invention is provide an organic light emission apparatus including an organic light emission element which suppresses or prevents a deterioration of light emission properties caused by generating of a dark spot for a long period of time, and an electronic equipment, which includes the organic light emission apparatus, having high reliability.

Such an advantage is realized by the invention described below.

APPLICATION EXAMPLE 1

According to this application example, there is provided an organic light emission apparatus includes a substrate, an organic light emission element that is disposed on the substrate, and a sealing layer covers the organic light emission element, in which the sealing layer includes a first sealing layer, a buffer layer, and a second sealing layer being sequentially stacked from the organic light emission element side, the second sealing layer is mainly made of silicon oxynitride, and includes an inner layer, an intermediate layer, and an outer layer being sequentially stacked from the organic light emission element side, and stress of the intermediate layer is equal to or less than stress of the inner layer, and stress of the outer layer is greater than the stress of the inner layer.

According to the organic light emission apparatus, for example, even when the foreign material is mixed into the organic light emission element included in the organic light emission apparatus at the time of forming the second sealing layer, generating of a dark spot due to the foreign material can be exactly suppressed or prevented in the intermediate layer. Accordingly, a deterioration of the light emission properties caused by the generation of the dark spot can be suppressed or prevented.

APPLICATION EXAMPLE 2

In the organic light emission apparatus, it is preferable that the stresses of the inner layer, the intermediate layer, and the outer layer are respectively 0 MPa or more and 1000 MPa or less.

Accordingly, even when the foreign material is mixed at the time of forming the second sealing layer, the intermediate layer significantly exerts a function as a cushion layer (easily deformable layer) absorbing the convex state due to the foreign material. Accordingly, deformation due to the foreign material can be compensated for with the intermediate layer.

APPLICATION EXAMPLE 3

In the organic light emission apparatus, it is preferable that the stress of the inner layer is 100 MPa or more and 300 MPa or less, the stress of the intermediate layer is 0 MPa or more and 200 MPa or less, and the stress of the outer layer is 400 MPa or more and 1000 MPa or less.

Accordingly, even when the foreign material is mixed at the time of forming the second sealing layer, the intermediate layer significantly exerts the function as a cushion layer (easily deformable layer) absorbing the convex state due to the foreign material. Accordingly, the deformation due to the foreign material can be compensated for with the intermediate layer.

APPLICATION EXAMPLE 4

In the organic light emission apparatus, it is preferable that a thickness of the intermediate layer is the greatest among the thicknesses of the inner layer, the intermediate layer, and the outer layer.

Accordingly, generating of a wrinkle on the buffer layer by an increase of the stress can be prevented by suppressing an increase of the stress of the second sealing layer.

APPLICATION EXAMPLE 5

In the organic light emission apparatus, it is preferable that the thickness of the inner layer is equal to the thickness of the outer layer.

Accordingly, generating of the wrinkle on the buffer layer by the increase of the stress can be prevented by suppressing an increase of the stress of the second sealing layer.

APPLICATION EXAMPLE 6

In the organic light emission apparatus, it is preferable that the thicknesses of the inner layer, the intermediate layer, and the outer layer are respectively 100 nm or more and 300 nm or less.

Accordingly, generating of the wrinkle on the buffer layer by the increase of the stress can be prevented by suppressing an increase of the stress of the second sealing layer.

APPLICATION EXAMPLE 7

In the organic light emission apparatus, it is preferable that a total thickness of the inner layer, the intermediate layer, and the outer layer is 400 nm or more and 1200 nm or less.

Accordingly, generating of the wrinkle on the buffer layer by the increase of the stress can be prevented by suppressing an increase of the stress of the second sealing layer.

APPLICATION EXAMPLE 8

In the organic light emission apparatus, it is preferable that in the inner layer, when a transmittance of a peak generated at near 1000 $cm^{-1}$ in a measurement using a Fourier transformation type infrared spectrophotometer is represented by $A_1$ [%], and the transmittance of a peak generated at near 3200 $cm^{-1}$ is represented by $B_1$ [%], $B_1/A_1$ is 0.1 or more and 0.25 or less, in the intermediate layer, when the transmittance of the peak generated at near 1000 $cm^{-1}$ in the measurement using the Fourier transformation type infrared spectrophotometer is represented by $A_2$ [%], and the transmittance of the peak generated at near 3200 $cm^{-1}$ is represented by $B_2$ [%], $B_2/A_2$ is 0.18 or more and 0.30 or less, and in the outer layer, when the transmittance of the peak generated at near 1000 $cm^{-1}$ in the measurement using the Fourier transformation type infrared spectrophotometer is represented by $A_3$ [%], and the transmittance of the peak generated at near 3200 $cm^{-1}$ is represented by $B_3$ [%], $B_3/A_3$ is 0.01 or more and 0.07 or less.

Accordingly, deterioration of the light emission properties caused by the generation of the dark spot can be suppressed or prevented.

APPLICATION EXAMPLE 9

In the organic light emission apparatus, it is preferable that at the time of forming the intermediate layer, the intermediate layer is formed by being divided in plural times.

Accordingly, the intermediate layer can be stably formed.

APPLICATION EXAMPLE 10

In the organic light emission apparatus, it is preferable that the first sealing layer is mainly made of silicon oxynitride, and the buffer layer is mainly made of resin material.

Accordingly, the first sealing layer functions as the gas barrier layer exerting the gas barrier properties for preventing invading of moisture, oxygen, or the like, and the buffer layer functions as a planarization layer which flatly forms the second sealing layer by reducing unevenness of the surface of the first sealing layer.

APPLICATION EXAMPLE 11

According to this application example, there is provided an electronic equipment including the organic light emission apparatus of the application example of the invention.

With the organic light emission apparatus of such a configuration, reliability of the electronic equipment is increased.

BRIEF DESCRIPTION OF THE DRAWINGS

The invention will be described with reference to the accompanying drawings, wherein like numbers reference like elements.

DESCRIPTION OF EXEMPLARY EMBODIMENTS

Organic EL Apparatus

Figure 1:
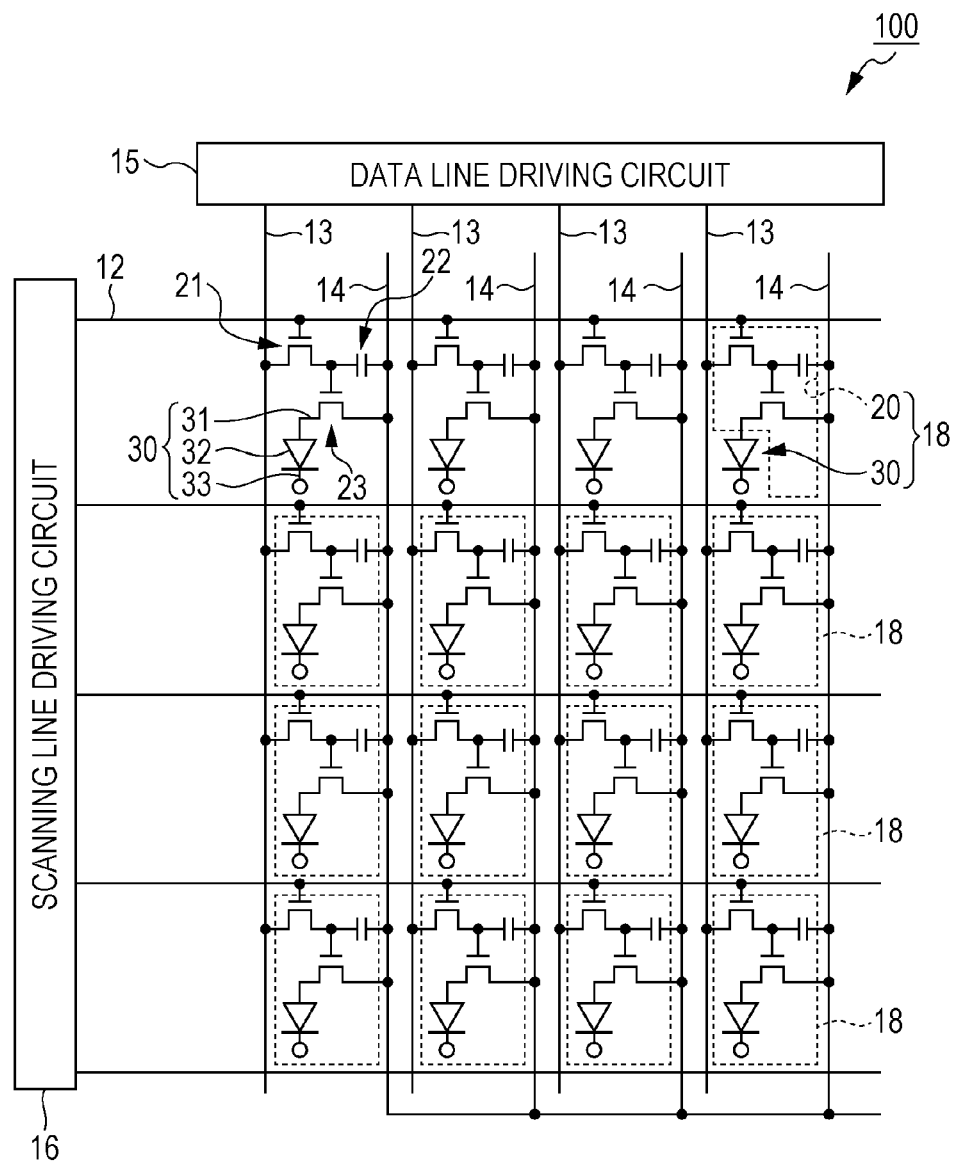
FIG. 1 is an equivalent circuit diagram illustrating an electrical configuration of an embodiment in which an organic light emission apparatus of the invention is applied to an organic EL apparatus.
Figure 2:
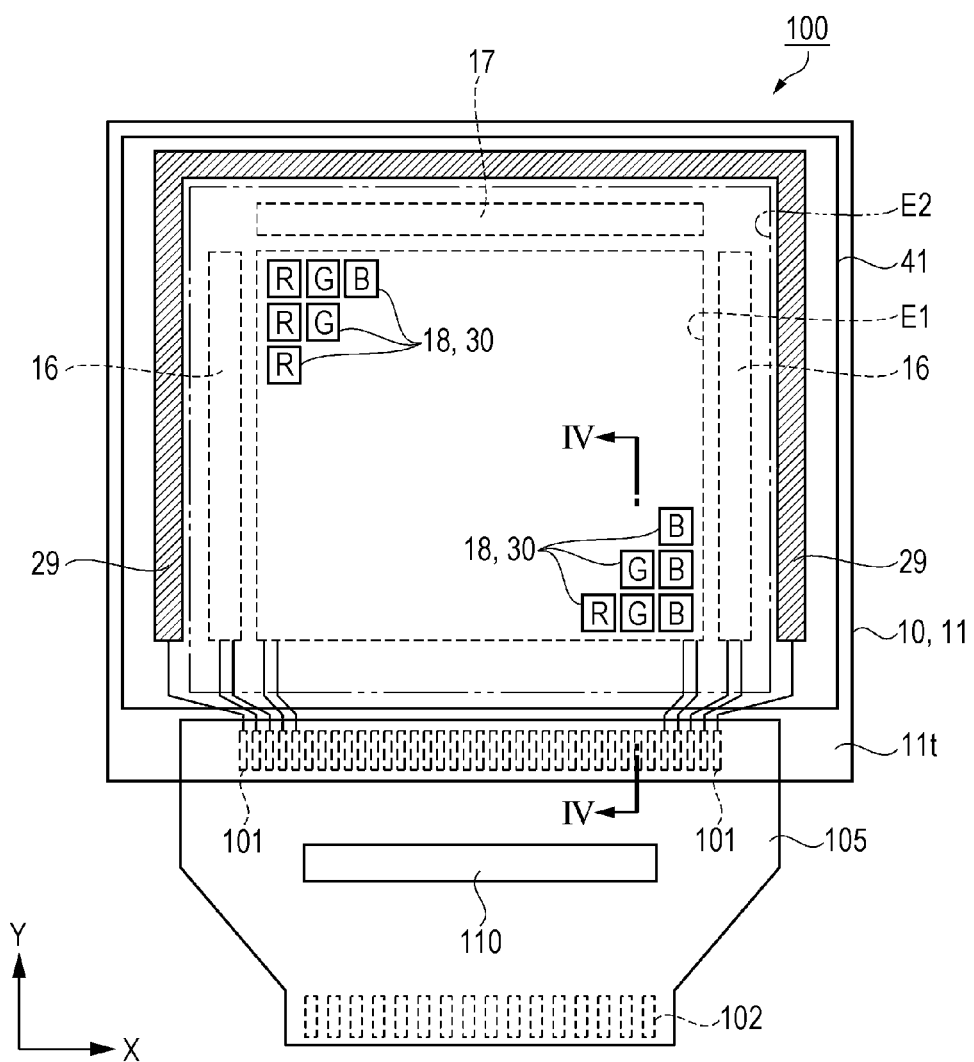
FIG. 2 is a schematic plan view illustrating a configuration of the embodiment in which an organic light emission apparatus of the invention is applied to an organic EL apparatus.
Figure 3:
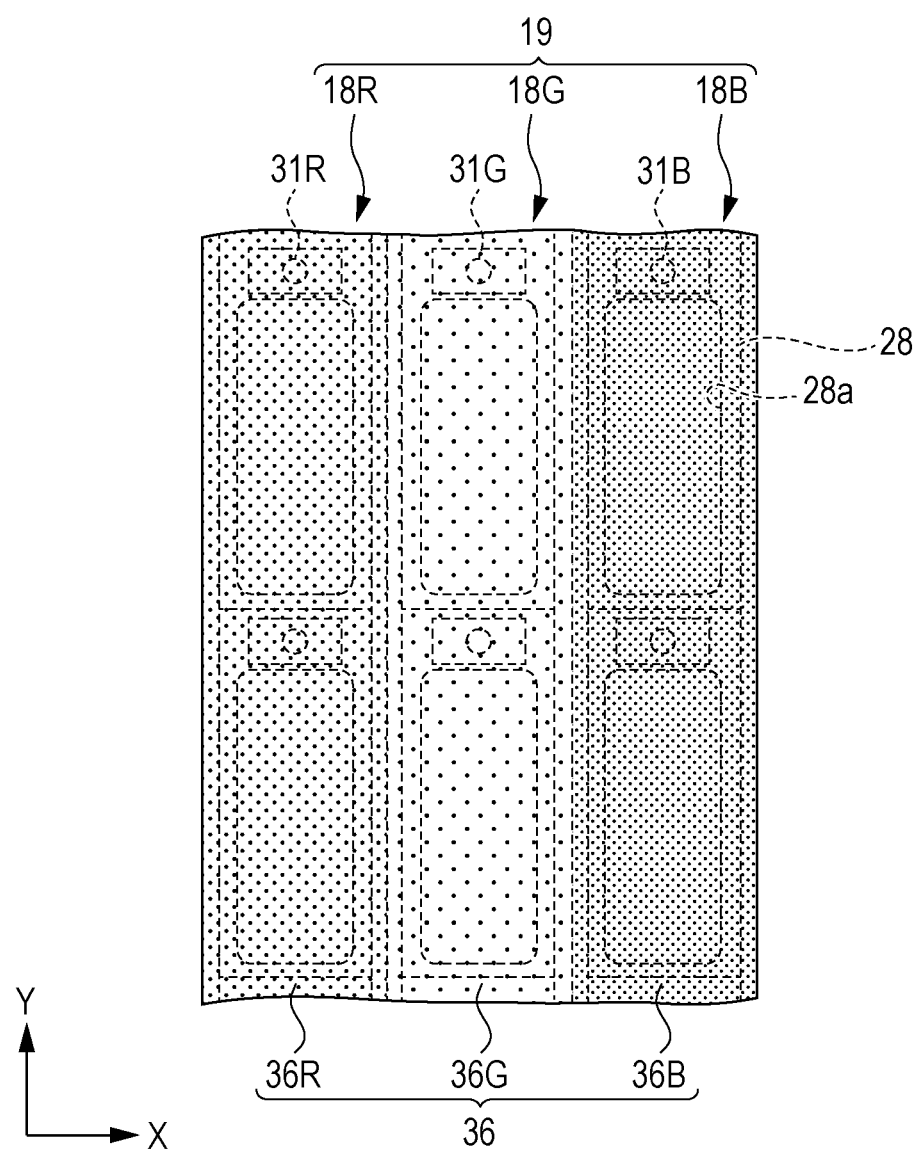
FIG. 3 is a schematic plan view illustrating an arrangement of pixels in the organic EL apparatus illustrated in FIG. 1 and FIG. 2.
Figure 4:
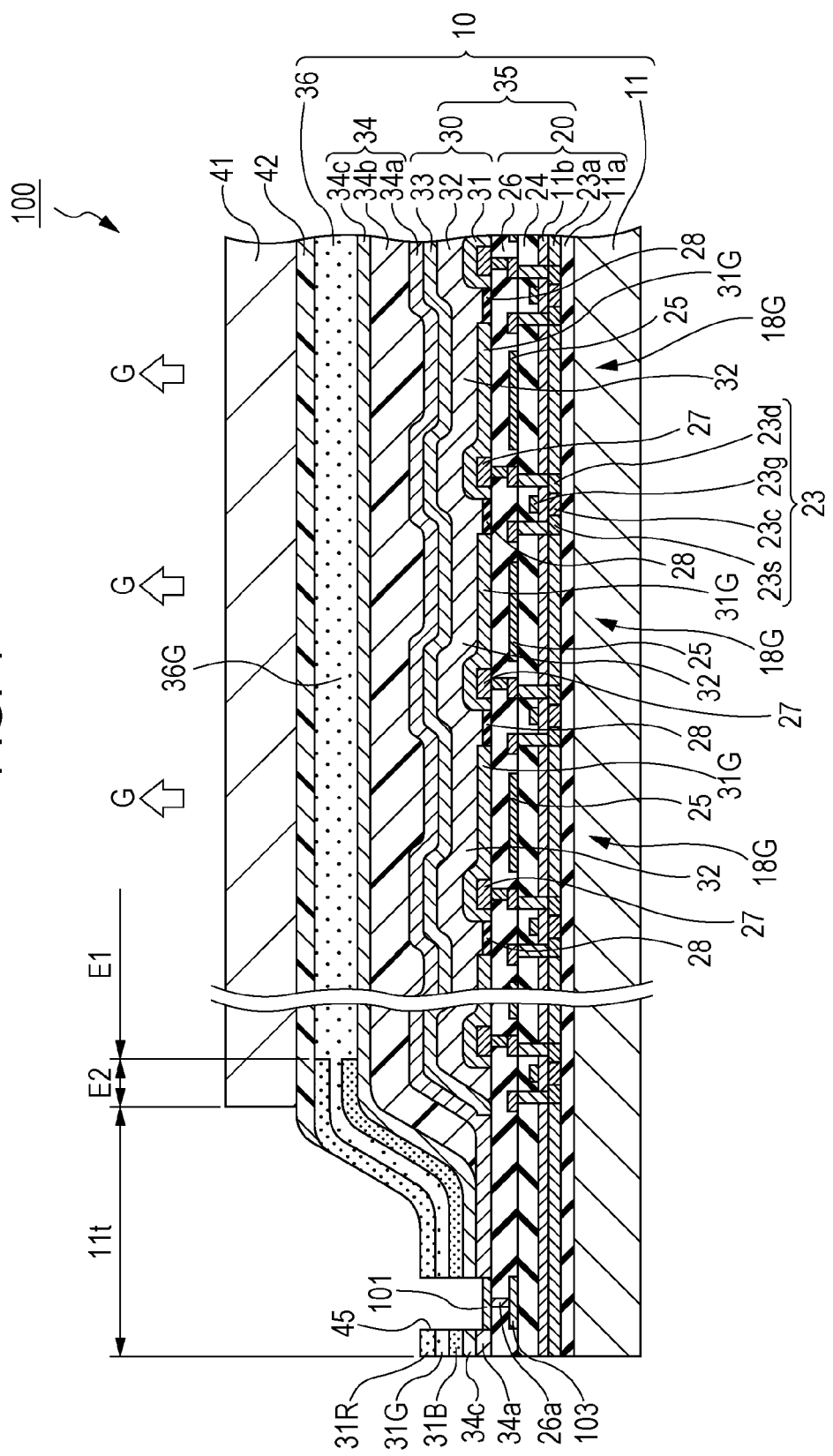
FIG. 4 is a schematic sectional view illustrating a structure of the organic EL apparatus taken along a IV-IV line in FIG. 2.
Figure 5:
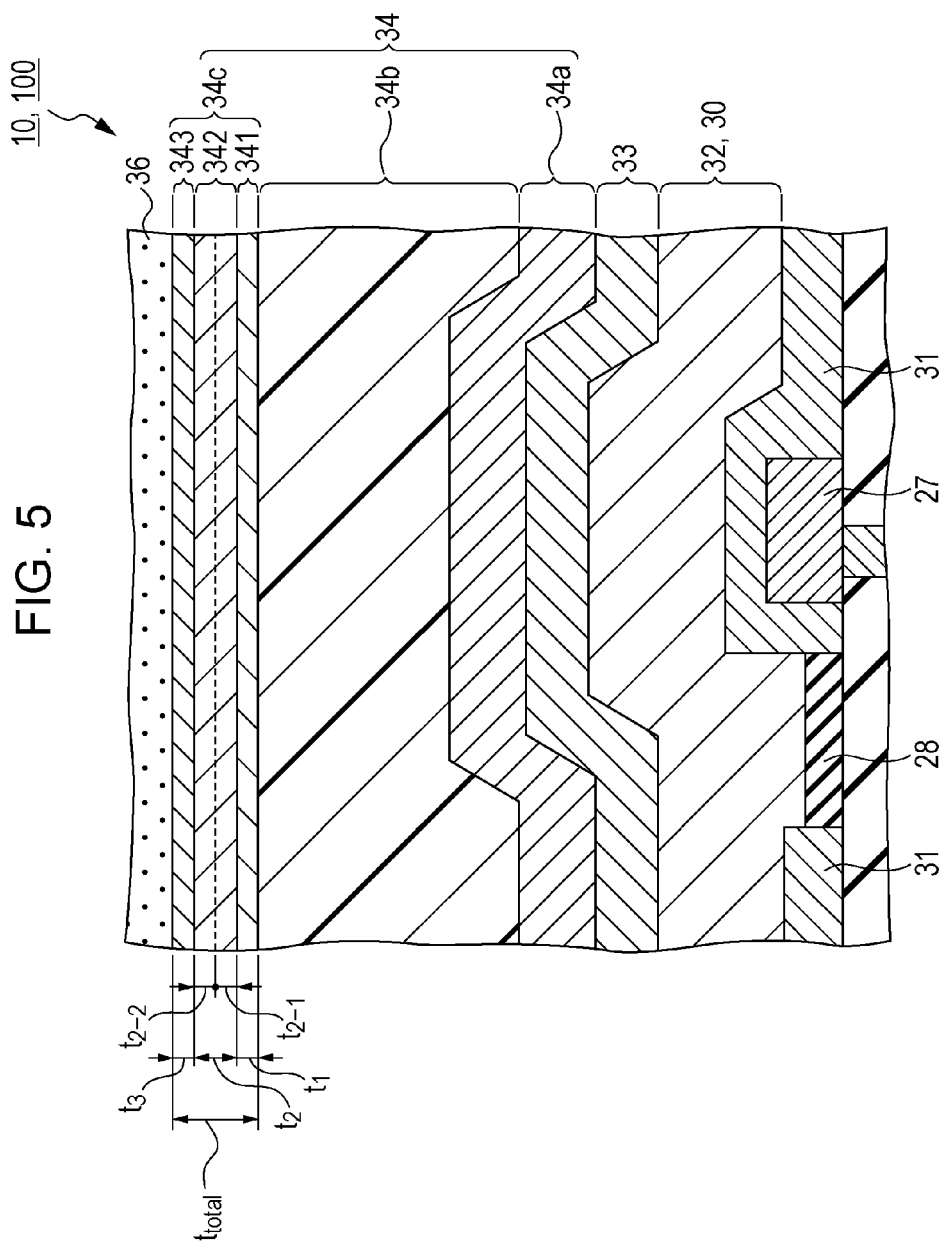
FIG. 5 is a partial enlarged-longitudinal sectional view which is a partially enlarged view from a contact electrode of an organic EL apparatus to the second sealing layer illustrated in FIG. 4.
Figure 6:
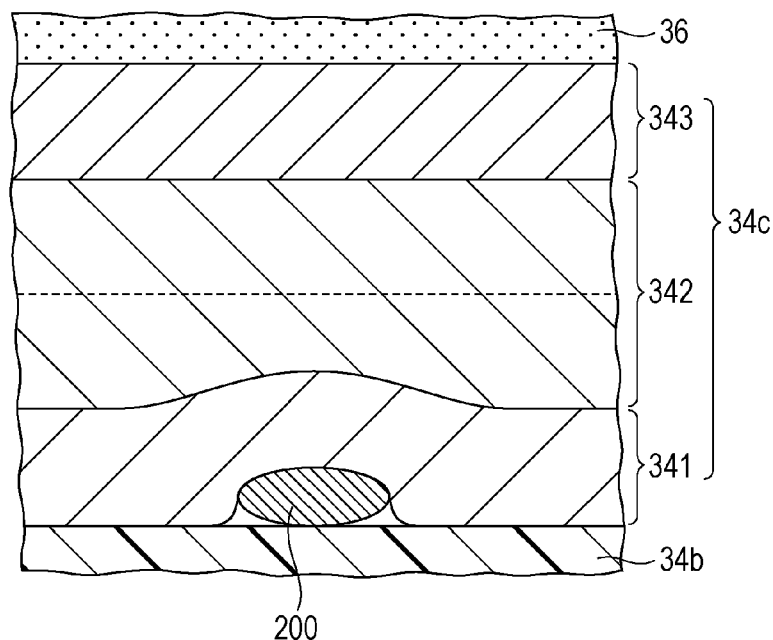
FIG. 6 is a longitudinal sectional view illustrating an example of a state of a second sealing layer in a case in which a foreign material is mixed.
Figure 7:
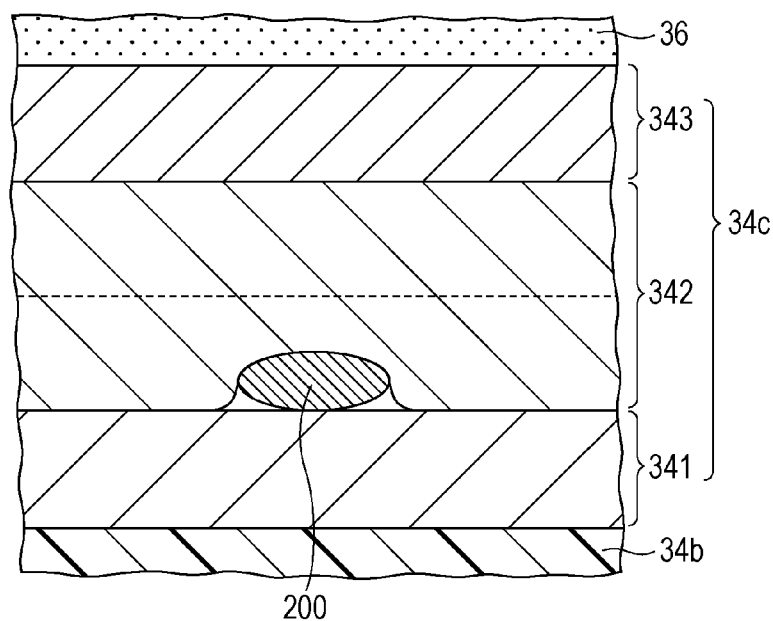
FIG. 7 is a longitudinal sectional view illustrating an example of a state of a second sealing layer in a case in which a foreign material is mixed.
Figure 8:
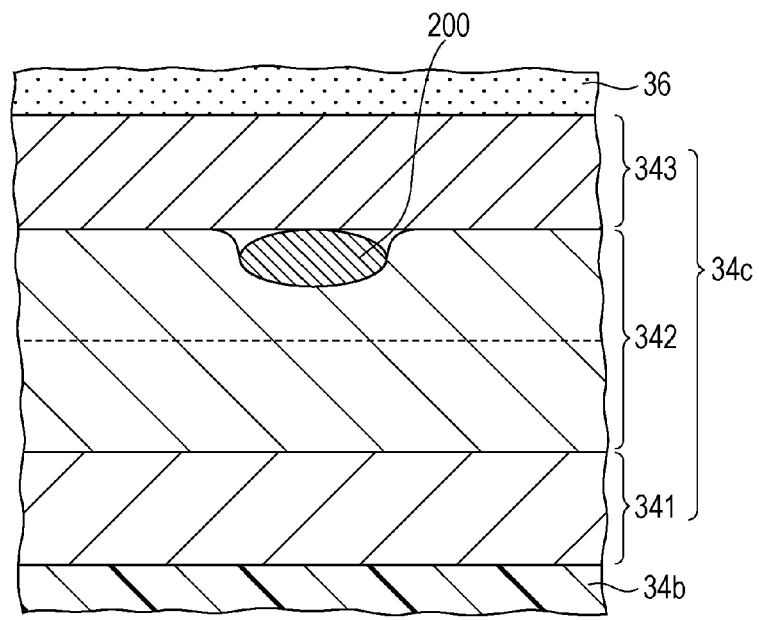
FIG. 8 is a longitudinal sectional view illustrating an example of a state of a second sealing layer in a case in which a foreign material is mixed.

FIG. 1 is an equivalent circuit diagram illustrating an electrical configuration of an embodiment in which an organic light emission apparatus of the invention is applied to an organic EL apparatus. FIG. 2 is a schematic plan view illustrating a configuration of the embodiment in which an organic light emission apparatus of the invention is applied to an organic EL apparatus. FIG. 3 is a schematic plan view illustrating an arrangement of pixels in the organic EL apparatus illustrated in FIG. 1 and FIG. 2. FIG. 4 is a schematic sectional view illustrating a structure of the organic EL apparatus taken along a IV-IV line in FIG. 2. FIG. 5 is a partial enlarged-longitudinal sectional view which is a partially enlarged view from a contact electrode of an organic EL apparatus to the second sealing layer illustrated in FIG. 4. FIG. 6 to FIG. 8 are longitudinal sectional views illustrating an example of a state of a second sealing layer in a case in which a foreign material is mixed. Moreover, hereinafter, for convenience of description, front sides of FIG. 1 to FIG. 3 when viewed on a paper is respectively referred to as a "top", and a back side thereof when viewed on the paper is referred to as a "bottom". Upper sides of FIG. 4 to FIG. 8 are respectively referred to as a "top", and lower sides thereof are respectively referred to as a "bottom". In addition, in FIG. 1 to FIG. 8, in order to easily view drawings, a size, ratio, or the like of each component are appropriately disclosed by being made different. In addition, in embodiments hereinafter, for example, in a case of describing "on a substrate", it indicates a case in which a component is disposed on the substrate so as to be contact with the substrate, a case in which the component is disposed on the substrate through the other component, a case in which the component is disposed on the substrate so as to be partially contact with the substrate, or a case in which a part of the component is disposed through the other component.

As illustrated in FIG. 1, the organic EL apparatus 100 includes a plurality of scanning lines 12 and a plurality of data lines 13 which intersect with each other, and a plurality of power lines 14 which are arranged in parallel with respect to each of the plurality of data lines 13. In addition, the organic EL apparatus 100 includes a scanning line driving circuit 16 to which the plurality of the scanning lines 12 are connected, and a data line driving circuit 15 to which the plurality of data lines 13 are connected. In addition, the organic EL apparatus 100 includes a plurality of sub pixels 18 which are disposed in a matrix shape by corresponding to each intersection portion of the plurality of scanning lines 12 and the plurality of data lines 13.

In addition, each of the sub pixels 18 includes an organic EL element 30 which is an emission element and a pixel circuit 20 which controls driving of the organic EL element 30.

The organic EL element 30 includes a pixel electrode 31 which functions as an anode, an opposite electrode 33 which functions as a cathode, and a functional layer 32 including an organic emission layer provided between the pixel electrode 31 and the opposite electrode 33. Such an organic EL element 30 can be notated as an electrical diode.

The pixel circuit 20 includes a transistor for switching 21, a storage capacitor 22, and a transistor for driving 23. The transistor for driving 23 and the transistor for driving 23 can be formed, for example, using a MOS transistor of a n channel type or a p channel type, or a thin film transistor (TFT).

A gate of the transistor for switching 21 is connected to the scanning line 12, any one of a source and a drain is connected to the data line 13, and the other of the source and the drain is connected to a gate of the transistor for driving 23.

In addition, any one of a source and a drain of the transistor for driving 23 is connected to the pixel electrode 31 of the organic EL element 30, and the other of the source and the drain is connected to the power line 14.

Further, the storage capacitor 22 is connected between a gate of the transistor for driving 23 and the power line 14.

In the organic EL apparatus 100 of a configuration described above, when the transistor for switching 21 is turned on by driving the scanning line 12, at this time, a potential based on an image signal supplied from the data line 13 is retained in the storage capacitor 22 through the transistor for switching 21. According to the potential of the storage capacitor 22, that is, a gate potential of the transistor for driving 23, the transistor for driving 23 is determined to be turned on or off. Also, when the transistor for driving 23 is turned on, an amount of current corresponding to the gate potential is flew in the functional layer 32 sandwiched between the pixel electrode 31 and the opposite electrode 33 from the power line 14 through the transistor for driving 23. As a result, the organic EL element 30 emits the light according to the current amount flowing in the functional layer 32.

Moreover, a configuration of the pixel circuit 20 is not limited thereto, and for example, a transistor for an emission controlling which controls a conduction between the pixel electrode 31 and the transistor for driving 23 may be provided between the pixel electrode 31 and the transistor for driving 23.

In addition, as illustrated in FIG. 2, the organic EL apparatus 100 includes an element substrate 10 and a counter substrate 41 which is disposed opposite the element substrate 10.

In the element substrate 10, a display region E1 (in drawings, illustrated in a dashed line) and the dummy region E2 (in drawings, illustrated in a two-dot line) outside of the display region E1 are provided. The outside of the dummy region E2 is a non-display region.

In the display region E1, the sub pixels 18 are disposed in a matrix shape. Each of the sub pixel 18 includes the organic EL element 30 which is the emission element as described above, and is configured to be possible to emit any one of colors of red (R), green (G), and blue (B) according to an operation of the transistor for switching 21 and the transistor for driving 23.

In the embodiment, the sub pixels 18 which are possible to emit the same color are arranged in a first direction, and the sub pixels 18 which are possible to emit different colors are arranged in a second direction intersecting (orthogonal to) the first direction, and thus, the sub pixels 18 are arranged in a so called stripe method. Moreover, hereinafter, the first direction is described as a Y direction, and the second direction is described as a X direction.

Moreover, an arrangement of the sub pixels 18 in the element substrate 10 is not limited to the stripe method, and may be a mosaic method, or a delta method.

In addition, a peripheral circuit for mainly emitting the organic EL element 30 of the sub pixels 18 is provided in the dummy region E2. For example, as illustrated in FIG. 2, a pair of scanning line driving circuits 16 extending in the Y direction is provided at a position in which the display region E1 is sandwiched in the X direction. An inspection circuit 17 is provided at a position along the display region E1 between the pair of scanning line driving circuits 16.

In the element substrate 10, a wire layer 29 is disposed extendedly in the Y direction along the pair of scanning line driving circuits 16 and in the X direction along the inspection circuit 17 so as to surround the dummy region E2. An opposite electrodes 33 which is included in the organic EL element 30 is formed as a common electrode throughout a plurality of the organic EL elements 30, that is, the plurality of sub pixels 18. In addition, the opposite electrode 33 is formed so as to reach the non-display region from the display region E1, and is electrically connected to the wire layer 29 in the non-display region.

The element substrate 10 is greater than the counter substrate 41, a plurality of connection terminals 101 for electrically connecting to an outside driving circuit are arranged in the X direction on one side portion (a side portion between an end portion of the element substrate 10 downward in FIG. 2 and the dummy region E2, hereinafter, the side portion is referred to as a "terminal portion 11*t*") protruding in the Y direction from the counter substrate 41. A flexible circuit substrate (FPC) 105 is connected to the plurality of connection terminals 101. In the FPC 105, an IC for driving 110 is mounted. Moreover, the IC for driving 110 includes the data line driving circuit 15 described above. The FPC 105 includes an input terminal 102, which is connected to an inputting side of the IC for driving 110 through wires, and an output terminal (not illustrated), which is connected to an outputting side of the IC for driving 110 through the wires. The data line 13 or the power line 14 in the element substrate 10 side is electrically connected to the IC for driving 110 through the connection terminal 101 and the FPC 105. A wire connected to the scanning line driving circuit 16 or the inspection circuit 17 is electrically connected to the IC for driving 110 through the connection terminal 101 and the FPC 105. The opposite electrode 33 as the common cathode is also electrically connected to the IC for driving 110 through the wire layer 29 and connection terminal 101, and the FPC 105. Therefore, a control signal from the IC for driving 110, the potential for driving (VDD), or the like is supplied to any one of the plurality of connection terminals 101 arranged in the terminal portion 11*t*. As a method of electric connection between the plurality of connection terminals 101 in the element substrate 10 side and an output terminal in the FPC 105 side, a well-known method can be used, for example, there is a method using a thermoplastic anisotropic conductive film, a method using thermosetting anisotropic adhesive, or the like.

Next, a configuration of the sub pixels 18 and a plan arrangement thereof will be described with reference to FIG. 3. The organic EL apparatus 100 is configured by combining the organic EL element 30, which is possible to emit white light, with color filters 36 including colored layers of red (R), green (G), and blue (B).

As illustrated in FIG. 3, a sub pixel 18R which is possible to emit red (R) light, a sub pixel 18G which is possible to emit green (G) light, and a sub pixel 18E which is possible to emit blue (B) light are arranged sequentially in the X direction. In addition, the sub pixels 18 which are possible to emit the same color light are arranged in the Y direction. It is a configuration in which three of the sub pixels 18R, the sub pixel 18G, and the sub pixel 18B arranged in the X direction is indicated as one pixel 19.

Moreover, in the embodiment, an arrangement pitch of each of the sub pixel 18R, the sub pixel 18G, the sub pixel 18B in the X direction is less than 5 μm. The sub pixel 18R, the sub pixel 18G, the sub pixel 18B are disposed with intervals of 0.5 μm to 1.0 μm therebetween in the X direction. The arrangement pitch of the sub pixel 18R, the sub pixel 18G, and the sub pixel 18B in the Y direction is less than 10 μm.

The pixel electrode 31 in the sub pixel 18, in the embodiment, is a substantially rectangular shape, and is disposed in which a longitudinal direction thereof is in the Y direction. Moreover, the pixel electrode 31 is referred to as the pixel electrode 31R, the pixel electrode 31G, and the pixel electrode 31B by corresponding to an emission color. The insulating layer 28 is formed, which functions as a partition wall for insulating between the pixel electrode 31R, the pixel electrode 31G, and the pixel electrode 31B by dividing an outer line of the pixel electrode 31R, the pixel electrode 31G, and the pixel electrode 31B. Accordingly, an opening portion 28*a* is formed on the pixel electrode 31R, the pixel electrode 31G, and the pixel electrode 31B, and each of the pixel electrode 31R, the pixel electrode 31G, and the pixel electrode 31B in the opening portion 28*a* are came into contact with the functional layer 32. A plan shape of the opening portion 28*a* is also a substantially rectangular shape. Moreover, a substantial rectangular shape means a rectangle, a shape in which corner portions of a rectangle become round, a shape in which a short edge side of a rectangle becomes circular, and the like.

In addition, the colored layer 36R of red (R) of the color filter 36 is formed so as to overlap with a plurality of the pixel electrodes 31R which are arranged in the Y direction. The colored layer 36G of green (G) is formed so as to overlap a plurality of the pixel electrodes 31G which are arranged in the Y direction. The colored layer 36B of blue (B) is formed so as to overlap with a plurality of the pixel electrodes 31B which are arranged in the Y direction. That is, the colored layer 36R, the colored layer 36G, and the colored layer 36B having different colors extend in the Y direction and form in a stripe shape, and are formed by being came into contact with each other in the X direction.

Next, a structure of the organic EL apparatus 100 will be described with reference to FIG. 4.

Moreover, FIG. 4 illustrates a structure of the sub pixel 18 in the display region E1, and a structure of the terminal portion 11*t* in the outside of the dummy region E2.

As illustrated in FIG. 4, in the display region E1, the organic EL apparatus 100 includes a base material (substrate) 11 and the element substrate 10 including the pixel circuit 20, the organic EL element 30, the sealing layer 34 sealing the plurality of organic EL elements 30, the color filter 36, which are sequentially formed on the base material 11. In addition, the counter substrate 41 which is disposed opposite the element substrate 10 is also included therein.

The counter substrate 41 is made of a transparent substrate, for example, a glass, or the like, and in order to protect the color filter 36 formed on the sealing layer 34 in the element substrate 10, the element substrate 10 is disposed opposite through a transparent resin layer 42.

The element substrate 10 and the counter substrate 41 are disposed oppositely to each other with intervals, and the intervals are filled with a transparent resin material, and thus the transparent resin layer 42 is formed. As the transparent resin material, for example, there is a resin material of a urethane base, an acryl base, an epoxy base, a polyolefin base, or the like. A thickness of the transparent resin layer 42 is 10 μm to 100 μm.

Emission from the functional layer 32 of the sub pixel 18R, the sub pixel 18G, and the sub pixel 18B (sub pixel 18G is illustrated in FIG. 4) is reflected to a reflecting layer 25 to be described later, and transmitted through the color filter 36 and output from the counter substrate 41 side. That is, the organic EL apparatus 100 is a light emission apparatus of a top emission type.

Since the organic EL apparatus 100 is a top emission type, the base material 11 can be made of a transparent substrate such as a glass, or a non-transparent substrate such as silicone or ceramic. Hereinafter, a case in which a MOS transistor is used in the pixel circuit 20 will be exemplified.

The first insulating film 11a covering a surface of the base material 11 is formed. The semiconductor layer 23a of the transistor for driving 23 covering the first insulating film 11a is formed. A second insulating film 11b which functions as a gate insulating film covering the semiconductor layer 23a is formed. A gate electrode 23g is formed on a position opposite to a panel region 23c of the semiconductor layer 23a through the second insulating film 11b. The first interlayer insulating film 24 covering the gate electrode 23g is formed to have, for example, a thickness of 300 nm to 2 μm. The first interlayer insulating film 24 is subjected to a planarization process so that a generated unevenness of a surface becomes a plan by covering the transistor for driving 23 of the pixel circuit 20, or the like. corresponding to each of the source electrode 23s and the drain region 23d of the semiconductor layer 23a, a contact hole penetrating the second insulating film 11b and the first interlayer insulating film 24 is formed. Such a contact hole is filled-in so that a conducting layer is formed, an electrode or a wiring, which is connected to the patterned transistor for driving 23 is formed. In addition, the conducting layer is made of, for example, aluminum having light reflectivity, an alloy of aluminum, silver (Ag), copper (Cu), or the like, and these are patterned, such that the reflecting layer 25 is independently formed in every sub pixel 18. An illustration thereof is omitted in FIG. 4; however, the transistor for switching 21 or the storage capacitor 22 in the pixel circuit 20 is also formed on the base material 11.

Further, the second interlayer insulating film 26 which covers the reflecting layer 25 and the first interlayer insulating film 24, is formed to have, for example, a thickness of 10 nm to 2 μm. In addition, next, the contact hole for electrically connected to the pixel electrode 31 and the transistor for driving 23 is formed so as to penetrating the second interlayer insulating film 26. A material constituting the first insulating film 11a, the second insulating film 11b, the first interlayer insulating film 24, and the second interlayer insulating film 26, for example, silicon oxide or nitride, or silicon oxynitride can be used.

In order to fill-in the contact hole formed on the second interlayer insulating film 26, the conducting layer (first the conducting layer) covering the second interlayer insulating film 26 is formed, and the contact electrode 27 is formed by patterning the conducting layer. Further, the conducting layer (second conducting layer) covering the contact electrode 27 is formed, and the pixel electrode 31 (pixel electrode 31R, pixel electrode 31G, and pixel electrode 31B) (sub pixel 18G is illustrated in FIG. 4) is formed by patterning the conducting layer. Moreover, the contact electrode 27 (connection electrode) is made of aluminum or an alloy thereof, in addition, the pixel electrode 31 (pixel electrode 31R, pixel electrode 31G, pixel electrode 31B) is made of a transparent conducting layer of indium tin oxide (ITO), or the like.

The insulating layer 28 (partition wall) is formed by dividing an outer line portion of the pixel electrode 31R, the pixel electrode 31G, and the pixel electrode 31B. Accordingly, while securing insulating properties of the pixel electrode 31R, the pixel electrode 31G, and the pixel electrode 31B, the opening portion 28a is formed on the pixel electrode 31R, the pixel electrode 31G, and the pixel electrode 31B. The insulating layer 28 is formed to have a height of approximately 1 μm using, for example, photosensitive resin of an acryl base, so as to divide each of the pixel electrode 31R, the pixel electrode 31G, and the pixel electrode 31B.

Moreover, in the embodiment, the insulating layer 28, which is made of photosensitive resin for making each of the pixel electrode 31R, the pixel electrode 31G, and the pixel electrode 31B be in an insulating state, is formed; however, the pixel electrode 31R, the pixel electrode 31G, and the pixel electrode 31B may be divided using an insulating inorganic material of oxide silicon, or the like.

The functional layer 32 is formed by, for example, a gas-phase process such as a vacuum deposition method or an ion plating method so as to be came into contact with the pixel electrode 31R, the pixel electrode 31G, and the pixel electrode 31B (sub pixel 18G is illustrated in FIG. 4), and a surface of the insulating layer 28 is also covered with the functional layer 32. Moreover, the functional layer 32 does not need to cover the entire surface of the insulating layer 28, and the functional layer 32 may be formed on a region divided in the insulating layer 28, therefore, not necessarily, as illustrated in FIG. 4, the parietal portion of the insulating layer 28 does not need to be covered with the functional layer 32.

The functional layer 32 includes, for example, a hole injecting layer, a hole transporting layer, an organic emission layer, and an electron transporting layer. In the embodiment, with respect to the pixel electrode 31, the hole injecting layer, the hole transporting layer, the organic emission layer, the electron transporting layer are respectively formed by the gas-phase process, and sequentially stacked so that the functional layer 32 is formed. Moreover, a configuration of the layers of the functional layer 32 is not limited thereto, and may include the intermediate layer controlling a movement of holes and electrons, which are a carrier.

The organic emission layer is preferable to have a configuration in which emission of white light is possible, and for example, can adopt a configuration of combining an organic emission layer which is possible to emit the red light, an organic emission layer which is possible to emit the blue light, and an organic emission layer which is possible to emit the green light.

Sequentially, the opposite electrode 33 as the common cathode covering the functional layer 32 is formed. The opposite electrode 33 is formed to have a thickness of a degree, for example, a degree in which an alloy of Mg and Ag has a thickness capable of obtaining the light permeability and the light reflectivity (for example, 10 nm to 30 nm). Accordingly, a plurality of the organic EL element 30 is formed on an upper side of the base material 11.

Moreover, by forming the opposite electrode 33 in a state in which light permeability and light reflectivity are included, an optical resonator may be formed between the reflecting layer 25 and the opposite electrode 33 in each of the sub pixel 18R, the sub pixel 18G, and the sub pixel 18B. The optical resonator has a different optical distance between the reflecting layer 25 and the opposite electrode 33 in each of the sub pixel 18R, the sub pixel 18G, and the sub pixel 18B, such that light of a specific resonance wavelength is emitted. Hereby, a color purity of emission from the sub pixel 18R, the sub pixel 18G, and the sub pixel 18B can be increased. The optical distance can be calculated by multiplying a reflectivity index and thicknesses of various functional films between the reflecting layer 25 constituting the optical resonator and the opposite electrode 33 constituting the optical resonator. Therefore, as a method in which the optical distance is different in each of the sub pixel 18R, the sub pixel 18G, and the sub pixel 18B, a method in which thicknesses of the pixel electrode 31R, the sub pixel 18G, and the sub pixel 18B are made differently, or a method in which a thickness of the second interlayer insulating film 26 between the reflecting layer 25 and the pixel electrode 31R, the pixel electrode 31G, and the pixel electrode 31B is made differently, can be adopted.

In addition, in the display region E1, the organic EL apparatus 100 includes the base material 11, and the element substrate 10 including the pixel circuit 20, the organic EL element 30, the sealing layer 34 sealing the plurality of organic EL elements 30, the color filter 36, which are sequentially formed on the base material 11. In addition, the counter substrate 41 which is disposed opposite the element substrate 10 is also included therein.

Moreover, in the element substrate 10, the pixel circuit 20 is configured to have the first insulating film 11a, the semiconductor layer 23a, the second insulating film 11b, the first interlayer insulating film 24, and the second interlayer insulating film 26. The organic EL element 30 is configured to have the pixel electrode 31, the functional layer 32, and the opposite electrode 33. A mount substrate 35 is configured to have the pixel circuit 20 and the organic EL element 30.

As illustrated in FIG. 4, in order to prevent moisture, oxygen, or the like from invading, the sealing layer 34 covering the plurality of organic EL elements 30 is formed.

In the embodiment, the sealing layer 34 is a multilayer body in which the first sealing layer (cathode protection layer) 34a, a buffer layer (planarization layer) 34b, the second sealing layer (gas barrier layer) 34c having different functions from each other are stacked sequentially from the opposite electrode 33 side (organic EL element 30).

The first sealing layer 34a and the second sealing layer 34c are mainly made of silicon oxynitride (SiON), and the buffer layer 34b is mainly made of a resin material.

As described in above related art, the first sealing layer 34a is mainly made of silicon oxynitride, thereby exerting the gas barrier properties for preventing moisture, oxygen, or the like from being invaded.

The second sealing layer 34c (gas barrier layer), in the same manner as the first sealing layer 34a (cathode protection layer), is also mainly made of silicon oxynitride (SiON) and is a layer having gas barrier properties for preventing moisture, oxygen, or the like from invading. By a function of the second sealing layer 34c, the sealing layer 34 prevents moisture, oxygen, or the like from invading into the functional layer 32.

The buffer layer 34b is made of a resin material as a main material.

Since the buffer layer 34b is interposed between the first sealing layer 34a and the second sealing layer 34c, functions of both of the first sealing layer 34a and the second sealing layer 34c can be surely exerted.

In addition, in a manufacturing method of the organic EL apparatus to be described later, the buffer layer 34b is formed to be coated by a printing method of a screen printing method, or a constant discharging method, or the like, thereby making it possible to make a plan surface by planarizing a surface (upper surface) of the buffer layer 34b. As a result, the buffer layer 34b relaxes unevenness of the surface of the first sealing layer 34a, and functions as the planarization layer which makes the second sealing layer 34c be flat.

As a configuration material of the buffer layer 34b, various resin materials having transparency can be used, and for example, epoxy resin, acryl resin, and the like are exemplified, and one or two or more of these materials can be used; however, in the drawings, epoxy resin is preferably used. By using the epoxy resin, a function as the planarization layer can be further surely exerted in the buffer layer 34b.

On the sealing layer 34, corresponding to the sub pixel 18R, the sub pixel 18G, and the sub pixel 18B of each color, the colored layer 36R, the colored layer 36G, and the colored layer 36B (sub pixel 18G is illustrated in FIG. 4) are formed. As a forming method of the color filter 36 including the colored layer 36R, the colored layer 36G, and the colored layer 36B, a method is exemplified in which a photosensitive resin layer is formed by applying a photosensitive resin material including a color material, and a resultant is exposed and developed by a photolithography method. The colored layer 36R, the colored layer 36G, and the colored layer 36B may have any color and same color, or may have at least one color different from the other colors.

Next, a configuration of the terminal portion 11t of the element substrate 10 and peripheries thereof will be described.

As illustrated in FIG. 4, in the terminal portion 11t of the element substrate 10, the connection terminal 101 is formed on the second interlayer insulating film 26 in the same manner as the pixel electrode 31. In addition, the connection terminal 101 is connected to the wire layer 103 formed on the first interlayer insulating film 24 through the conducting layer in the contact hole 26a formed in the second interlayer insulating film 26. In FIG. 4, a description of a signal wiring connected to the pixel circuit 20 or the pixel circuit 20 on the base material 11, a configuration of the peripheral circuit of the scanning line driving circuit 16, or the like is omitted; however, each of a plurality of the connection terminals 101 is electrically connected to circuits or the signal wirings thereof through the wire layer 103.

The wire layer 103 is preferably patterned with the reflecting layer 25 using the conducting layer formed on the first interlayer insulating film 24; however, the wire layer 103 may be made of a configuration material different from the reflecting layer 25.

In addition, the connection terminal 101 is preferably patterned with the pixel electrode 31 using the conducting layer formed on the second interlayer insulating film 26; however, the connection terminal 101 may be made of a configuration material different from the pixel electrode 31.

In the terminal portion 11t of the element substrate 10, the first sealing layer 34a, the second sealing layer 34c, the colored layer 36B, the colored layer 36G, and the colored layer 36R are stacked sequentially, and an opening portion 45 penetrating these layers is formed on the connection terminal 101. These layers are not formed on at least a part of the connection terminal 101, and the connection terminal 101 is exposed in the opening portion 45.

In other words, the first sealing layer 34a and the second sealing layer 34c made of an inorganic material in the sealing layer 34 are formed to cover a plurality of the organic EL element 30 in the display region E1 (refer to FIG. 2), and are formed to cover the terminal portion 11t as well. The color filter 36 is configured to have the colored layer 36R, the colored layer 36G, and the colored layer 36B, which are formed in order of green (G), blue (B), and red (R), corresponding to the sub pixel 18R, the sub pixel 18G, and the sub pixel 18B, and any one of the colored layer 36R, the colored layer 36G, and the colored layer 36B is formed to cover the display region E1, and the terminal portion 11t as well. Also, the opening portion 45 is formed so as to penetrate the first sealing layer 34a, the second sealing layer 34c, the colored layer 36B, the colored layer 36G, and the colored layer 36R.

Three of the colored layer 36R, the colored layer 36G, and the colored layer 36B are formed to reach the insulating layer 28 at a boundary between the dummy region E2 (refer to FIG. 2) and the display region E1, from the outer line of periphery sides of the element substrate 10 of the terminal portion 11t, and the colored layer 36R, the colored layer 36G, and the colored layer 36B, which overlap with the insulating layer 28, are protected by the counter substrate 41 through the transparent resin layer 42.

As described above, the second sealing layer 34c is a layer having gas barrier properties for preventing moisture, oxygen, or the like from invading into the functional layer 32. In this case, when a lost portion in which the gas barrier properties is deteriorated is generated in the second sealing layer 34c, it is concern that moisture, oxygen, or the like invades from the lost portion thereinto. Also, when the moisture, oxygen, or the like reach the functional layer 32, an injection of the carrier (holes or electrons) into the organic emission layer is suppressed, such that brightness of emission deteriorates, or emission function itself is lost due to quality of the functional layer 32 is changed, and thus a scotoma, which is a so called dark spot, is likely to be generated. When the dark spot is generated, reliability of the organic EL apparatus 100 is deteriorated.

As a cause that the lost portion where the gas barrier properties are deteriorated is generated, mainly, a follow description will be considered.

At the time of forming the sealing layer 34, the sealing layer 34 is formed to be overlapped with the first sealing layer 34a, the buffer layer 34b, and the second sealing layer 34c in this order in a chamber for forming (not illustrated); however, in this forming process, for example, a configuration material of the first sealing layer 34a attached to a wall portion of the chamber for forming becomes a mass, and drops on the buffer layer 34b as a foreign material 200 (for example, refer to FIG. 6). Also, when the second sealing layer 34c is formed on the buffer layer 34b in a state described above, the lost portion which causes a convex state by the foreign material 200 has crack.

In regard to above description, the organic EL apparatus 100 has a configuration which prevents a generation of the lost portion due to the foreign material 200, and further, is possible to suppress or prevent generation of the dark spot, which causes deterioration of emission properties of the organic EL apparatus 100. Hereinafter, the configuration will be described.

As illustrated in FIG. 5, the second sealing layer 34c includes an inner layer 341 (first layer), the intermediate layer 342 (second layer), and an outer layer 343 (third layer) which are sequentially disposed from the organic EL element 30 side.

When stress (film stress) of the inner layer 341 is set to $\sigma_1$, stress (film stress) of the intermediate layer 342 is set to $\sigma_2$, and stress (film stress) of the outer layer 343 is set to $\sigma_3$, the stress $\sigma_2$ is less than the stress $\sigma_1$, the stress $\sigma_3$ is greater than the stress $\sigma_1$, that is, a relationship of $\sigma_2 \leq \sigma_1 < \sigma_3$ is satisfied. Moreover, all of the stress $\sigma_1$, the stress $\sigma_2$, and the stress $\sigma_3$ are a pressure stress of the thickness direction of the second sealing layer 34c.

As described later, the second sealing layer 34c mainly made of silicon oxynitride is formed by a vapor phase film forming method such as an ion plating method. For this reason, the inner layer 341, the intermediate layer 342, and the outer layer 343 are formed of a porous body in which granular made of silicon oxynitride are stacked. In addition, in the respective layers constituted with the above described porous bodies, it is possible to establish a stress intensity relationship ($\sigma_2 \leq \sigma_1 < \sigma_3$) by setting the degree of the density of the granular bodies, that is, how dense the granular bodies are. Meanwhile, "how dense the granular bodies are" can be set by adjusting, for example, the pressure, discharge current, and the like in a chamber for forming the layers during the formation of the respective layers.

Also, since a relationship of $\sigma_2 \leq \sigma_1 < \sigma_3$ is satisfied, the intermediate layer 342 is the best flexible layer among the inner layer 341, the intermediate layer 342, and the outer layer 343. Accordingly, as illustrated in FIG. 6 to FIG. 8, even when the foreign material 200 is mixed in the second sealing layer 34c at the time of forming, the intermediate layer 342 can function as a cushion layer (easily deformable layer), which absorbs a convex state by the foreign material 200.

For example, as illustrated in FIG. 6, the foreign material 200 is mixed in between forming of the buffer layer 34b and forming of the inner layer 341. In this case, the inner layer 341 formed on the foreign material 200 is deformed; however, an influence thereof is fully prevented from reaching the outer layer 343 by being compensated with the intermediate layer 342. Accordingly, a lost portion caused by the convex state due to the foreign material 200 is prevented from being generated in a rattan blind shape, therefore, in the organic EL apparatus 100, the gas barrier properties is maintained for a long time, and deterioration of light emission properties which causes a generation of the dark spot is suppressed or prevented.

In addition, in a state illustrated in FIG. 7, the foreign material 200 is mixed in between forming of the inner layer 341 and forming of the intermediate layer 342. In this case, since the intermediate layer 342 formed on the foreign material 200 is deformed so as to be possible to compensate the influence thereof, the influence is fully prevented from reaching the outer layer 343. Accordingly, as a state illustrated in FIG. 6, in the organic EL apparatus 100, for a long period of time, deterioration of emission which causes a generation of a dark spot is suppressed or prevented.

In addition, in a state illustrated in FIG. 8, the foreign material 200 is mixed in between forming of the intermediate layer 342 and forming of the outer layer 343. In this case, right below of the foreign material 200, since the intermediate layer 342 is deformed so as to be possible to compensate the influence thereof, the influence is fully prevented from reaching the outer layer 343. Accordingly, as states illustrated in FIG. 6 and FIG. 7, in the organic EL apparatus 100, for a long period of time, the deterioration of emission which causes a generation of a dark spot is suppressed or prevented.

Accordingly, in the second sealing layer 34c, even when the foreign material 200 is mixed into any layers, the deterioration of emission which causes a generation of a dark spot is possible to be suppressed or prevented for a long period of time, it is a fail-safe structure. Accordingly, improvement of reliability during using the organic EL apparatus 100 can be attained.

Moreover, a size of the foreign material 200 is changed according to forming condition of each of the inner layer 341, the intermediate layer 342, and the outer layer 343; however, an average diameter thereof is preferably, for example, 0.5 µm or less.

In addition, after the relationship of $\sigma_2 \leq \sigma_1 < \sigma_3$ is satisfied, any of the stress $\sigma_1$, the stress $\sigma_2$ and the stress $\sigma_3$ is preferable to be 0 MPa or more and 1000 MPa or less.

Further, within the numerical range, the stress $\sigma_1$ is preferably 100 MPa or more and 300 MPa or less. The stress $\sigma_2$ is preferably 0 MPa or more and 200 MPa or less. The stress $\sigma_3$ is preferably 400 MPa or more and 1000 or less.

Also, each of layers are set in such a numerical range, properties like a cushion are significantly exerted in the intermediate layer 342. Accordingly, the lost portion caused by the foreign material 200 can be reliably prevented, whereby the deterioration of emission which causes a generation of a dark spot is suppressed or prevented for a long period of time. Moreover, the numerical range can be set by adjusting a pressure or discharge current in the chamber for forming, or the like at the time of forming each layer.

However, in order to resolve the convex state due to the foreign material 200 as much as possible, the second sealing layer 34c is considered to be formed with relatively thick thickness in a single layer without the multilayer body. However, in this case, as the thickness increases, the stress of the second sealing layer 34c increases, as a result, wrinkle, or the like is generated in the buffer layer 34b, and the buffer layer 34b exfoliates from the second sealing layer 34c. Moreover, when the stress of the second sealing layer 34c deteriorates, there is a tendency that the gas barrier properties in the second sealing layer 34c deteriorates.

In regard to this, in the second sealing layer 34c, the inner layer 341, the intermediate layer 342, and the outer layer 343 are respectively set in the numerical range, thereby preventing the entire stress in the second sealing layer 34c from excessively increasing, in addition, the gas barrier properties in the second sealing layer 34c can be maintained in just proportion.

As illustrated in FIG. 5, when the thickness of the inner layer 341 is set to $t_1$, the thickness of the intermediate layer 342 is set to $t_2$, and the thickness of the outer layer 343 is set to $t_3$, any of the thickness $t_1$, the thickness $t_2$, and the thickness $t_3$ are constant in a surface direction of the second sealing layer 34c. The thickness $t_2$ is the largest among the thickness $t_1$, the thickness $t_2$, and the thickness $t_3$, and the thickness $t_1$ and the thickness $t_3$ are equal to each other. In addition, the thickness $t_1$, the thickness $t_2$, and the thickness $t_3$ are preferably set to 100 nm or more and 300 nm or less, respectively. Further, a total thickness $t_{total}$ of the inner layer 341, the intermediate layer 342, and the outer layer 343, that is, the entire thickness of the second sealing layer 34c itself is preferably set to 400 nm or more and 1200 nm or less.

By an intensity relation of such a thickness, increasing of the stress of the second sealing layer 34c is suppressed, and generation of an wrinkle on the buffer layer 34b can be prevented.

Moreover, the intermediate layer 342 is formed divisionally in plural times (twice, in configuration of illustrated in FIG. 5) when the intermediate layer 342 is formed. In addition, a first thickness $t_{2-1}$ and a first thickness $t_{2-2}$ are equal to each other.

When the intermediate layer 342 is formed using an ion plating method to be described later, according to a degree of a size of the thickness $t_2$, temperature of the intermediate layer 342 exceeds a glass transition temperature of the organic EL element 30, and it is preferable to form the intermediate layer by dividing in plural times (twice) while cooling the intermediate layer in every step. Accordingly, the intermediate layer 342 can be stably formed.

Further, in the inner layer 341, when transmittance of a peak generated at near 1000 cm$^{-1}$ is set to $A_1$ [%], and transmittance of a peak generated at near 3200 cm$^{-1}$ is set to $B_1$ [%] at the time of measuring with a Fourier transformation type infrared spectrophotometer, $B_1/A_1$ is preferably 0.1 or more, and more preferably 0.1 or more and 0.25 or less.

In the intermediate layer 342, when transmittance of a peak generated at near 1000 cm$^{-1}$ is set to $A_2$ [%], and transmittance of a peak generated at near 3200 cm$^{-1}$ is set to $B_2$ [%] at the time of measuring with a Fourier transformation type infrared spectrophotometer, $B_2/A_2$ is preferably 0.18 or more, and more preferably 0.18 or more and 0.3 or less.

In the outer layer 343, when transmittance of a peak generated at near 1000 cm$^{-1}$ is set to $A_3$ [%], and transmittance of a peak generated at near 3200 cm$^{-1}$ is set to $B_3$ [%] at the time of measuring with a Fourier transformation type infrared spectrophotometer, $B_3/A_3$ is 0.07 or less, and more preferably 0.01 or more and 0.07 or less.

Moreover, this measuring condition is as follows.
Apparatus name: Thermo Nicolay 380
Light source: High luminance ceramic light source (infrared emitted from black body radiation)
Detector: MCT
Beam splitter: KBr
Resolution: 4.0 cm$^{-1}$
Prism: Diamond (refraction index=2.40)
Incident angle: 45°
Polarized light: Unpolarized light In addition, a measured result is corrected by a software in an apparatus so called installed an "advance ATR correction" in a measurement by ATR. (Accordingly, it is possible to compare with a transmittance light measurement.)

In addition, a condition of ATR correction is as follow.
Refraction index of crystal (diamond)=2.40
Refraction index of sample=1.50
Incident angle=45.0°
The number of Reflection=1.0.

In addition, when ratio of transmittance of each of layers is set in such a numerical range, it is contributed that the deterioration of emission characteristics which causes a generation of a dark spot is possible to be suppressed or prevented, in addition, a liquid type photosensitive resin including a colored material of blue can be reliably prevented from being transmitted into (invade) the second sealing layer 34c at the time of forming the color filter 36 (for example, the colored layer 36B) on the second sealing layer 34c using a spin coating method to be described later. Moreover, the numerical range of each ratio can be set by adjusting a pressure or discharge current in the chamber for forming, or the like at the time of forming each layer.

Manufacturing Method of Organic EL Apparatus

Next, a manufacturing method of the organic EL apparatus of the first embodiment will be described.

A manufacturing method of the organic EL apparatus 100 includes a pixel circuit forming process, an organic EL element forming process, a sealing layer forming process, a color filter forming process, a sealing layer etching process, and a substrate adhering process.

[1] First, the base material 11 is prepared, and the pixel circuit 20 is formed on the base material 11 (pixel circuit forming process).

Moreover, at the time of forming the pixel circuit 20, the peripheral circuit, the signal wiring, the reflecting layer 25, the contact electrode 27, and the like are formed together.

In addition, as a method in which the pixel circuit 20, or the like is formed on the base material 11, a well-known method can be used.

[2] Next, the organic EL element 30 is formed on the pixel circuit 20 (organic EL element forming process).

Moreover, at the time of forming the organic EL element 30, the insulating layer 28, and the like are also formed together.

In addition, as a method in which the organic EL element 30, or the like is formed on the pixel circuit 20, a well-known method can be used.

[3] Next, the first sealing layer 34*a* which covers the opposite electrode 33 and the terminal portion 11*t* included in the organic EL element 30 is formed.

A method for forming the first sealing layer 34*a* is not particularly limited; however, for example, a vapor phase film forming method, such as an ion plating method, a vacuum deposition method, a sputtering method, a laser ablation method is exemplified, among these, an ion plating method is preferable.

By forming the first sealing layer 34*a* in the ion plating method, when a granule constituted of silicon oxynitride is stacked from the opposite electrode 33, a film component being introduced into the opposite electrode 33 can be introduced along (in parallel) a thickness direction of the opposite electrode 33 (base material 11). That is, it is possible to cause the film component to fly into the opposite electrode along the thickness direction of the opposite electrode 33 with excellent directionality.

[4] Next, the buffer layer 34*b* covering the first sealing layer 34*a* is formed.

The buffer layer 34*b* is made of a resin material having transparency, and as a forming method thereof, for example, a method is preferable in which a liquid type material is applied and dried by a printing method such as a screen printing method, or a liquid phase forming film method such as a constant discharging method, using a resin material and a liquid type material (solvent) including a resin-soluble solvent. By the methods described above, the buffer layer 34*b* in which an upper surface thereof is subjected to planarization and made of a resin material, can be formed with excellent precision.

Moreover, each of the processes in [4], the buffer layer 34*b* is formed by supplying the liquid type material onto the first sealing layer 34*a*; however, in this case, as described above, the first sealing layer 34*a* is configured to have a film which does not allow transmittance (invading) of the liquid type material. For this reason, in the process in [4], a quality change or deterioration of the functional layer 32 due to the functional layer 32 comes into contact with the liquid type material can be appropriately suppressed or prevented.

[5] Next, in the second sealing layer 34*c* covering the buffer layer 34*b*, the inner layer 341, the intermediate layer 342, and the outer layer 343 are formed in this order. As a method for forming each layer, a method which is the same as the method described above for forming the first sealing layer 34*a* is used.

In this case, since the upper surface of the buffer layer 34*b* is a flattened surface, the second sealing layer 34*c* formed on the buffer layer 34*b* is formed as a flattened layer including a substantially uniform thickness without step portions.

Moreover, a sealing layer forming process is constituted by the processes described above in [3] to [5].

[6] Next, the colored layer 36B of blue (B) is formed.

For example, a photosensitive resin layer is formed by applying and drying a photosensitive resin including a color material of blue by spin coating method, and the photosensitive resin layer is exposed and developed, such that the colored layer 36B can be formed.

It is preferable that the colored layer 36B is patterned so as to be formed at a position corresponding to the sub pixel 18B, and the opening portion 45 is patterned (exposed and developed) so as to be formed at a part overlapping the connection terminal 101 in the terminal portion 11*t*.

[7] Next, the colored layer 36G of green (G) is formed.

The colored layer 36G is formed in the same method as the colored layer 36B. The colored layer 36G is patterned so as to be formed at a position corresponding to the sub pixel 18G and is patterned (exposed and developed) so that the opening portion 45 is formed on a part overlapping the connection terminal 101 in the terminal portion 11*t*.

[8] Next, the colored layer 36R of red (R) is formed.

The colored layer 36R is formed in the same method as the colored layer 36B. The colored layer 36R is patterned so as to be formed at a position corresponding to the sub pixel 18R, and is patterned (exposed and developed) so that the opening portion 45 is formed at a position where the connection terminal 101 in the terminal portion 11*t*.

Moreover, a color filter forming process is constituted by the processes in [6] to [8].

[9] Next, in the opening portion 45, the connection terminal 101 is exposed (sealing layer etching process) by removing the first sealing layer 34*a* and the second sealing layer 34*c* which are remained.

As a method for removing the first sealing layer 34*a* and the second sealing layer 34*c*, for example, a dry etching method in which the colored layer 36R, the colored layer 36G, and the colored layer 36B are used as a mask.

[10] Next, the element substrate 10 and the counter substrate 41 are bonded to each other (substrate adhering process) through the transparent resin layer 42 made of the transparent resin material.

A bonding process described above is performed by applying the transparent resin material having adhesives for covering the color filter 36, and then, pressing the counter substrate 41 to the base material 11 in a state in which the counter substrate 41 is disposed opposite the base material 11 side to which the transparent resin material is applied, for example.

As the transparent resin material, for example, thermosetting epoxy resin is exemplified.

In addition, the thickness of the transparent resin layer 42 is not particularly limited; however, the thickness thereof is set to approximately 10 μm or more and 100 μm or less.

After the processes of [1] to [10], as illustrated in FIG. 2, the FPC 105 is mounted on the terminal portion 11*t* of the element substrate 10, thereby making it possible to obtain the organic EL apparatus 100.

Electronic Equipment

Next, a head mounted display to which the electronic equipment of the invention is applied will be described.

Figure 9:
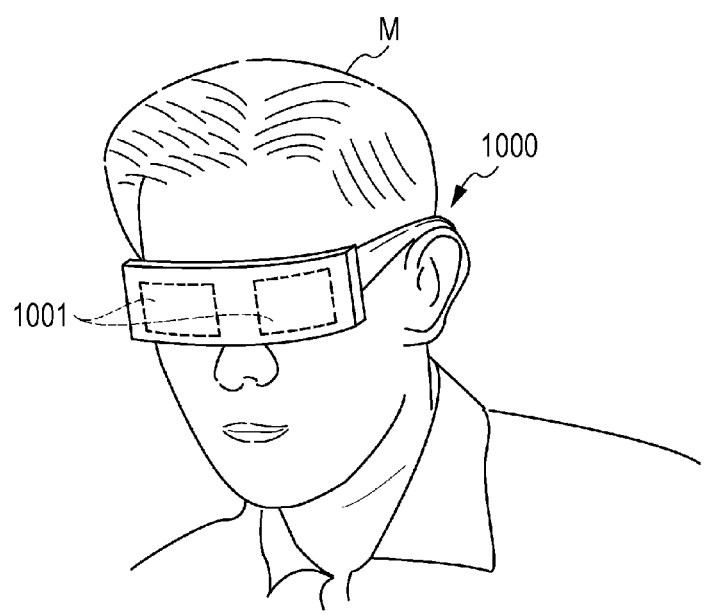
FIG. 9 is a schematic view in which an electronic equipment of the invention is applied to a head mounted display.

FIG. 9 is a schematic view of the head mounted display to which the electronic equipment of the invention is applied.

As illustrated in FIG. 9, a head mounted display (HMD) 1000 as the electronic equipment of the invention includes two display portions 1001 which are provided corresponding to right and left eyes. An observer M can see characters, images, or the like displayed in a display portion 1001 by mounting the head mounted display 1000 like glasses on his or her head. For example, when the image taking parallax is displayed on the right and left display portions 1001, the observer can enjoy a three-dimensioned image when watching.

In the display portion 1001, the above described organic EL apparatus 100 is mounted.

Therefore, the organic EL apparatus 100 including the organic EL element 30 in which the deterioration of emission causing a generation of a dark spot is suppressed or prevented for a long period of time, is mounted on the head mounted display 1000. For this reason, the head mounted display 1000 having high reliability can provided.

Moreover, the head mounted display 1000 is not limited to a case in which two display portions 1001 are included, and may be configured to have one display portion 1001 corresponding to either of right or left eye.

In addition, the electronic equipment of the invention, in addition to the head mounted display of FIG. 9, can be used in, for example, a personal computer (mobile type personal computer), a tablet terminal, a smart phone, a mobile telephone, a clock, a digital still camera, a television, or a video camera, a video tape recorder of a view finder type and a direct-view monitor type, a laptop type personal computer, a car navigation apparatus, a pager, an electronic organizer (including communicating function), an electronic dictionary, an electronic calculator, an electronic game equipment, a word processor, a workstation, a video phone, a security television monitor, an electronic binocular, a POS terminal, an equipment including a touch panel (for example, a cash dispenser of a financial institution and an automatic ticket vending machine), a medical equipment (for example, an electronic thermometer, a blood-pressure meter, a blood glucose meter, an electrocardiogram display apparatus, an ultrasound diagnostic apparatus, and an endoscopic denoted device), a fish finder, various measuring machines, meters (for example, instruments of vehicle, aircraft, or ship), a flight simulator, and also, various monitors, a projection type display apparatus, or the like.

Hitherto, the embodiments illustrating the organic light emission apparatus and the electronic equipment of the invention have been described; however, the invention is not limited thereto, each of portions constituting the organic light emission apparatus and the electronic equipment can be substituted by random configuration which exerts the same functions. In addition, arbitrary components may be added thereto.

EXAMPLES

Next, detailed examples of the invention will be described.
1. Forming a Second Sealing Layer
Sample 1
First, a substrate in which a layer corresponding to the buffer layer 34b is formed in advance is prepared.

Also, masses made of silicon oxynitride (SiON) having 0.5 μm or less diameter as the foreign material, are mounted on each sample on the substrate for the sample, and the number of mounted masses is 10 or more and 20 or less.

Next, by an ion plating method in a condition described below, an inner layer of the second sealing layer made of silicon oxynitride (SiON) is formed.
Inner Layer Forming Condition
    Pressure in chamber: 0.8 Pa
    Process gas: $N_2$
    Original material: SiO
    Discharge current value: 130 A
    Ar flow amount: 80 mL/m
    Moreover, an average thickness of the obtained inner layer is 200 nm, and an average film stress is 200 MPa.

Next, by an ion plating method in a condition to be described below, an intermediate layer of the second sealing layer made of silicon oxynitride (SiON) is formed.
Intermediate Layer Forming Condition
    Pressure in Chamber: 1.2 Pa
    Process gas: $N_2$
    Original material: SiO
    Discharge current value: 130 A
    Ar flow amount: 80 mL/m
    Moreover, an average thickness of the obtained intermediate layer is 400 nm, and an average of the film stress is 100 MPa.

Next, by the ion plating method in a condition to be described below, an outer layer of the second sealing layer made of silicon oxynitride (SiON) is formed.
Exterior Forming Condition
    Pressure in Chamber: 0.5 Pa
    Process gas: $N_2$
    Original material: SiO
    Discharge current value: 130 A
    Ar flow amount: 80 mL/m
    Moreover, an average thickness of the obtained outer layer is 200 nm, and an average of film stress is 700 MPa.
Sample 2
Other than that a particle diameter of the foreign material is in a range of more than 0.5 μm to less than 2 μm, in the same manner as the sample 1, the second sealing layer is obtained.
Sample 3
Other than that a particle diameter of the foreign material is in a range of 2 μm or more and less than 5 μm, in the same manner as the sample 1, the second sealing layer is obtained.
Sample 4
By an ion plating method in a condition to be described below, other than the second sealing layer of the single layer made of made of silicon oxynitride (SiON), in the same manner as the sample 1, the second sealing layer is obtained.
    Pressure in Chamber: 0.8 Pa
    Process gas: $N_2$
    Original material: SiO
    Discharge current value: 130 A
    Ar flow amount: 80 mL/m
    Moreover, an average thickness of the obtained second sealing layer 800 nm, and an average of the film stress is 200 MPa.
Sample 5
Other than the particle diameter of the foreign material is in a range of more than 0.5 μm to less than 2 μm, in the same manner as the sample 6, the second sealing layer is obtained.
Sample 6
Other than the particle diameter of the foreign material is in a range of 2 μm or more and less than 5 μm, in the same manner as the sample 6, the second sealing layer is obtained.

2. Evaluation of Gas Barrier Properties

Each of the samples is left at 48 hours, under a steam atmosphere of 65° C. and 90%. After that, it is determined whether or not each of 100 samples has a dark spot generated due to defection in the second sealing layer. The sample without dark spots, which has the gas barrier properties for preventing moisture, oxygen, or the like from invading into a part of the foreign material, is counted. If the number thereof is 90 or more, an evaluation result is good and it is illustrated as "◯" in Table, but if the number thereof is less than 90, the evaluation result is bad and it is illustrated as "x".

TABLE

| | Structure of second sealing layer | Diameter of Particle | The number of samples with gas barrier properties | Evaluation |
|---|---|---|---|---|
| Sample 1 | Multilayer | 0.5 μm or less | 90 | ◯ |
| Sample 2 | Multilayer | More than 0.5 μm and less than 2 μm | 92 | ◯ |
| Sample 3 | Multilayer | 2 μm or more and less than 5 μm | 94 | ◯ |
| Sample 4 | Single layer | 0.5 μm or less | 28 | x |
| Sample 5 | Single layer | More than 0.5 μm and less than 2 μm | 67 | x |
| Sample 6 | Single layer | 2 μm or more and less than 5 μm | 83 | x |

As illustrated in Table, stress of the intermediate layer, which is configured to have a multilayer body including the inner layer, the intermediate layer, and the outer layer, is equal to or less than stress of the inner layer, and the evaluation results are "good" in regard to the sample 1 to the sample 4 including the second sealing layer in which the stress of the outer layer is greater than the stress of the inner layer.

However, the evaluation results are "bad" in regard to the sample 5 to the sample 8 including the second sealing layer configured to have single layer.

In addition, in regard to the sample configured to have the second sealing layer including the inner layer, the intermediate layer, and the outer layer, even when the foreign material is mounted between the inner layer and the intermediate layer, and the foreign material is mounted between the intermediate layer and the outer layer, the same evaluation is performed, the evaluation result is "good".

The entire disclosure of Japanese Patent Application No.: 2015-073784, filed Mar. 31, 2015 is expressly incorporated by reference herein.

What is claimed is:

1. An organic light emission apparatus comprising:
   a substrate;
   an organic light emission element that is disposed above the substrate; and
   a sealing layer that covers the organic light emission element, wherein the sealing layer including a first sealing layer, a buffer layer, and a second sealing layer,
   wherein the first sealing layer, the buffer layer, and the second sealing layer are sequentially stacked from the organic light emission element side,
   wherein the second sealing layer consists essentially of silicon oxynitride, and includes an inner layer, an intermediate layer, and an outer layer,
   wherein the inner layer, the intermediate layer, and the outer layer are sequentially stacked from the organic light emission element side,
   wherein stress of the intermediate layer is less than stress of the inner layer, and stress of the outer layer is greater than the stress of the inner layer, and
   wherein at the time of forming the intermediate layer, the intermediate layer is formed by being divided in plural times with equal thickness.

2. The organic light emission apparatus according to claim 1, wherein the stresses of the inner layer, the intermediate layer, and the outer layer are respectively 0 MPa or more and 1000 MPa or less.

3. The organic light emission apparatus according to claim 2, wherein the stress of the inner layer is 100 MPa or more and 300 MPa or less,
   wherein the stress of the intermediate layer is 0 MPa or more and 200 MPa or less, and
   wherein the stress of the outer layer is 400 MPa or more and 1000 MPa or less.

4. The organic light emission apparatus according to claim 1, wherein a thickness of the intermediate layer is the greatest among the thicknesses of the inner layer, the intermediate layer, and the outer layer.

5. The organic light emission apparatus according to claim 1, wherein the thickness of the inner layer is equal to the thickness of the outer layer.

6. The organic light emission apparatus according to claim 1, wherein the thicknesses of the inner layer, the intermediate layer, and the outer layer are respectively 100 nm or more and 300 nm or less.

7. The organic light emission apparatus according to claim 1, wherein a total thickness of the inner layer, the intermediate layer, and the outer layer is 400 nm or more and 1200nm or less.

8. The organic light emission apparatus according to claim 1, wherein in the inner layer, when a transmittance of a peak generated at near 1000 cm$^{-1}$ in a measurement using a Fourier transformation type infrared spectrophotometer is represented by $A_I$ [%], and the transmittance of a peak generated at near 3200 cm$^{-1}$ is represented by $B_1$ [%], $B_1/A_I$ is 0.1 or more and 0.25 or less,
   wherein in the intermediate layer, when the transmittance of the peak generated at near 1000 cm$^{-1}$ in the measurement using the Fourier transformation type infrared spectrophotometer is represented by $A_2$ [%], and the transmittance of the peak generated at near 3200 cm$^{-1}$ is represented by $B_2$ [%], $B_2/A_2$ is 0.18 or more and 0.30 or less, and
   wherein in the outer layer, when the transmittance of the peak generated at near 1000 cm$^{-1}$ in the measurement using the Fourier transformation type infrared spectrophotometer is represented by $A_3$ [%], and the transmittance of the peak generated at near 3200 cm$^{-1}$ is represented by $B_3$ [%], $B_3/A_3$ is 0.01 or more and 0.07 or less.

9. The organic light emission apparatus according to claim 1, wherein the first sealing layer consists essentially of silicon oxynitride, and the buffer layer consists essentially of resin material.

10. An electronic equipment comprising:
    the organic light emission apparatus according to claim 1.

11. An electronic equipment comprising:
    the organic light emission apparatus according to claim 2.

12. An electronic equipment comprising:
    the organic light emission apparatus according to claim 3.

13. An electronic equipment comprising:
    the organic light emission apparatus according to claim 4.

14. An electronic equipment comprising:
    the organic light emission apparatus according to claim 5.

15. An electronic equipment comprising:
the organic light emission apparatus according to claim 6.
16. An electronic equipment comprising:
the organic light emission apparatus according to claim 7.
17. An electronic equipment comprising:
the organic light emission apparatus according to claim 8.
18. An electronic equipment comprising:
the organic light emission apparatus according to claim 9.

* * * * *